(12) United States Patent
Badzian et al.

(10) Patent No.: US 6,370,165 B1
(45) Date of Patent: Apr. 9, 2002

(54) DIAMOND COATINGS DEPOSITED ON WC-CO SUBSTRATE BY MULTIPLE LASER

(75) Inventors: Andrzej R. Badzian; Rustum N. Roy; Theresa Badzian; William R. Drawl, all of State College, PA (US); Pravin Mistry, Dearborn; Manuel C. Turchan, Northville, both of MI (US)

(73) Assignee: QQC, Inc., Dearborn, MI (US)

( * ) Notice: Subject to any disclaimer, the term of this patent is extended or adjusted under 35 U.S.C. 154(b) by 0 days.

(21) Appl. No.: 09/357,623

(22) Filed: Jul. 20, 1999

Related U.S. Application Data

(60) Provisional application No. 60/093,452, filed on Jul. 20, 1998.

(51) Int. Cl.[7] ............................................. H01S 3/30
(52) U.S. Cl. ............................... 372/7; 372/49; 372/75; 372/69
(58) Field of Search .............................. 372/7, 49, 75, 372/69; 445/24; 427/596

(56) References Cited

U.S. PATENT DOCUMENTS 6,200,183 B1 * 1/2001 Badzian et al. ................ 445/24
6,203,865 B1 * 1/2001 Badzian et al. ............. 427/596

* cited by examiner

Primary Examiner—Leon Scott, Jr.
(74) Attorney, Agent, or Firm—Harness, Dickey & Pierce, P.L.C.

(57) ABSTRACT

A diamond coating formed on a WC—Co substrate prepared through a process including employing a plasma and a variety of interactions from a multiple laser system demonstrates exceptional adhesion and indicates a durable cubic diamond structure. The coating on the WC—Co substrate is typically between 25 and 40 $\mu$m thick and has an average crystal size of between 10 and 20 $\mu$m. Various methods of confirming the cubic diamond structure of the coatings have been employed. The adhesion of the diamond coating to the substrate is very strong. An electron microprobe analysis shows tungsten and cobalt atoms incorporated into the film and a layer depleted in cobalt exists at the diamond-WC—Co interface. Particulates of WC—Co—C alloy are spread over the top surface, apparently formed by condensation from the vapor phase of metal-containing molecules. Carbon is confirmed as being the main component of the surface layer.

20 Claims, 6 Drawing Sheets

DIAMOND COATINGS DEPOSITED ON WC-CO SUBSTRATE BY MULTIPLE LASER

This application claims priority from provisional application Ser. No. 60/093452, filed Jul. 20, 1998.

TECHNICAL FIELD

The present invention is generally directed to diamond coatings. More particularly, the present invention is directed to diamond formation on a WC—Co (tungsten carbide-cobalt-carbon) substrate using multiple lasers.

BACKGROUND ART

The concept that diamond can be grown exclusively within its thermodynamic stability region is no longer valid. (Reference may be had to, for example, A. Badzian, T. Badzian, Int. J. of Refractory Metals and Hard Materials 15 (1997) 3.) The search for novel approaches to diamond synthesis, different from HP/HT and CVD operations, continues despite opinions that these two classical methods are sufficient for most applications. The new research is surrounded by the uncertainty in the growth mechanisms. This is the situation with the recent demonstrations of a laser induced process conducted in the open air (see, for example, P. Mistry, M. C. Turchan, S. Liu, G. O. Granse, T. Baurman, M. G. Shara, Innovations in Materials Research 1 (1996) 193) and on hydrothermal growth (see, for example, X-Z Zhao, R. Roy, K. A. Cherian, A. Badzian, Nature 285 (1997) 513). The chemical reaction paths are unknown for these two new processes, and an explanation does not seem to be forthcoming. Diamond coatings on WC—Co cutting tool inserts by the laser process are factual and have been successfully tested for wear resistance. Nevertheless, a plausible growth hypothesis has yet to be presented.

SUMMARY OF THE INVENTION

Accordingly, it is an object of the present invention to define a method of adhesion of a diamond coating on a substrate.

It is a further object of the present invention to define such a method as it applies between the diamond coating and a WC—Co substrate.

Still a further object of the present invention is apply the defined method to the requirements of electron field emission.

The process of applying a diamond coating to a WC—Co substrate to prepare includes the steps of employing a plasma and a variety of interactions from a multiple laser system using WC—Co substrates. The process is conducted in open air and does not involve hydrogen. Structural characterization of the diamond coatings, which have exceptional adhesion to cutting tool inserts, indicates a cubic diamond structure.

The coatings on the WC—Co substrate are typically between 25 and 40 $\mu$m thick. The average crystal size is between 10 and 20 $\mu$m. Various methods of confirming the cubic diamond structure of the coatings have been employed. The adhesion of the diamond coating to the substrate is very strong. An electron microprobe analysis shows tungsten and cobalt atoms incorporated into the film and a layer depleted in cobalt exists at the diamond-WC—Co interface. Particulates of W/Co/C alloy are spread over the top surface, apparently formed by condensation from the vapor phase of metal-containing molecules. Carbon is confirmed as being the main component of the surface layer.

Electron field emission current densities, useful for flat panel displays of 6 mA/cm$^2$ at an applied voltage of 3000 V for a film-anode distance of 20 $\mu$m has been measured.

BRIEF DESCRIPTION OF THE FIGURES

The present invention will be more fully understood by reference to the following detailed description of the preferred embodiments of the present invention when read in conjunction with the accompanying drawings, in which.

DETAILED DESCRIPTION OF THE PREFERRED EMBODIMENT

The drawings disclose the preferred embodiment of the present invention. While the configurations according to the illustrated embodiment are preferred, it is envisioned that alternate configurations of the present invention may be adopted without deviating from the invention as portrayed. The preferred embodiment is discussed hereafter.

The Process And Preparation Of A Sample

Laser assisted growth of diamond was discovered by one of the inventors herein during experiments on the surface modification of metal alloys. When $CO_2$ gas was involved, by a fortunate set of laser process parameters, a new type of deposit was recognized and was soon identified as diamond. (For a discussion on the actual discovery, see P. Mistry, M. C. Turchan, S. Liu, G. O. Granse, T. Baurman, M. G. Shara, Innovations in Materials Research 1 (1996)193).

Figure 1A:
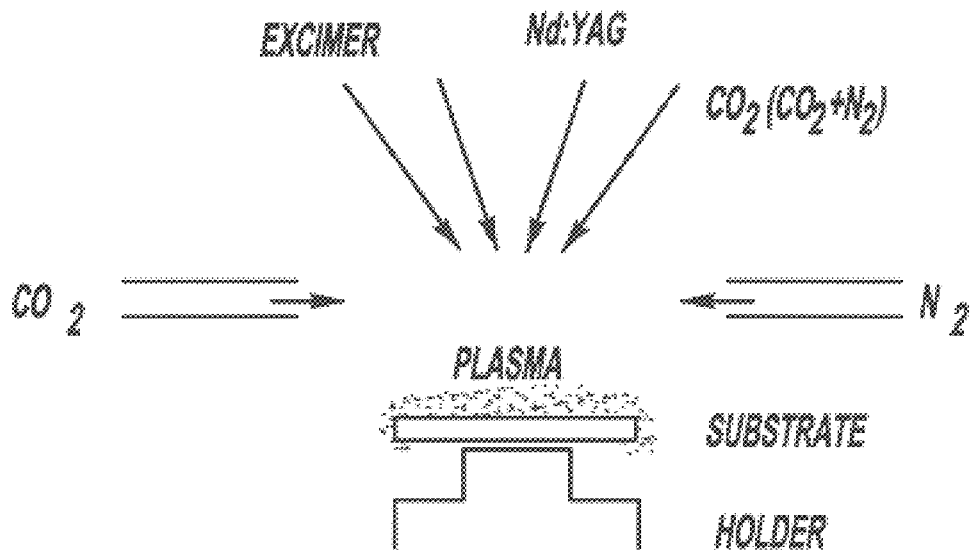
FIG. 1a is a schematic illustration of the process according to the present invention.
Figure 1B:
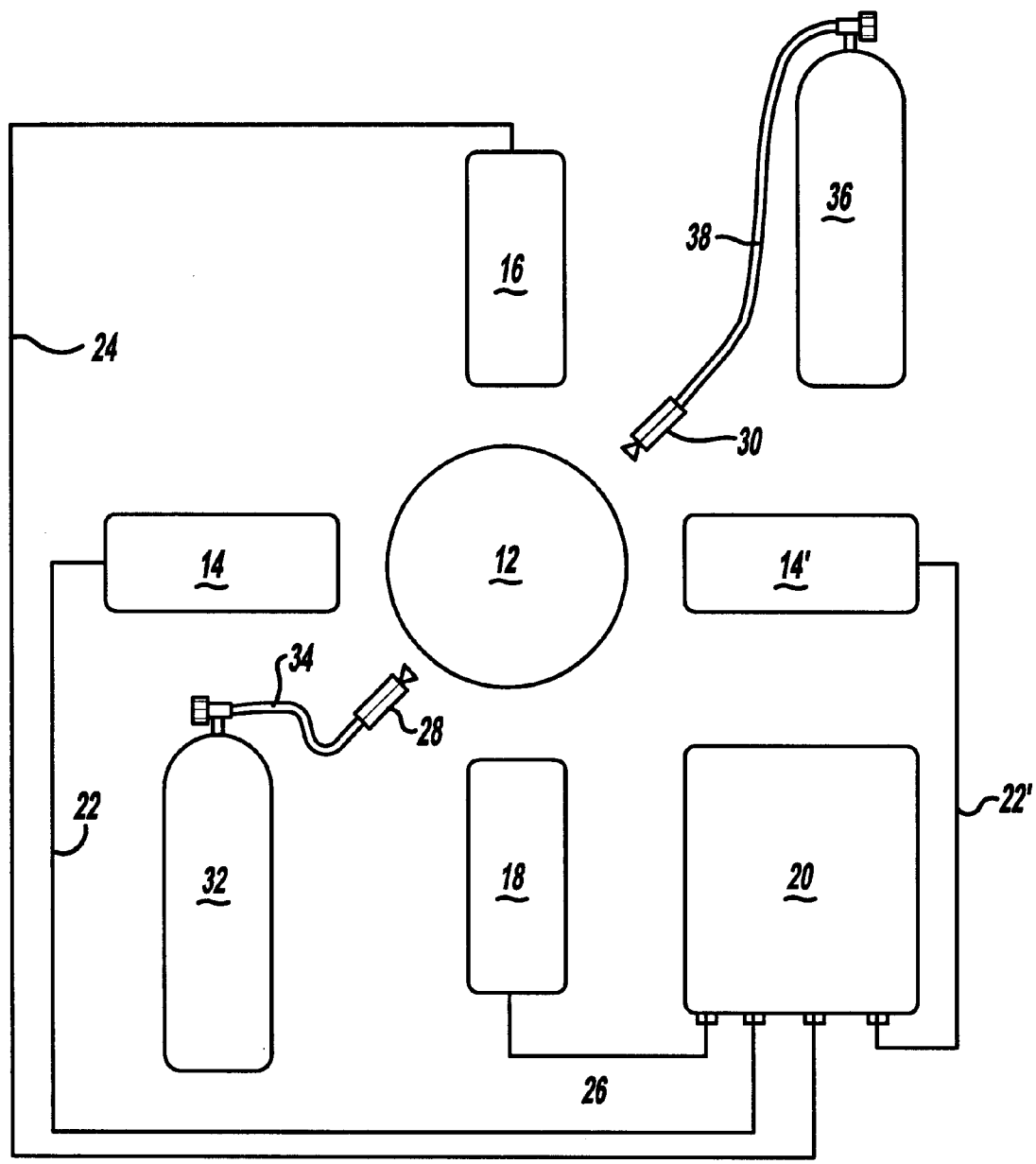
FIG. 1b is a plan view of a sample preparation station for fabricating the film-coated sample used for investigation in the present invention.

FIG. 1a is a schematic illustration of the process according to the present invention. The figure generally illustrates the lasers and gases with respect to the substrate. FIG. 1b discloses a plan view of a sample preparation station, generally illustrated as 10, which was established for the preparation of a substrate for study and use. A substrate support 12 is centrally disposed surrounded by an array of lasers. The lasers of choice include two excimer lasers 14, 14', one YAG:Nd laser 16, and one $CO_2$ laser 18. An alternate array of lasers having a different composition may be substituted for the described array, provided substantially the same results are achieved. However, these particular lasers were selected after due experimentation as having sufficient power to ignite the plasma which engulfs the substrate as set forth hereinafter.

A CPU 20 is provided for selectively operating the lasers 14, 14', 16, and 18 according to a prepared program. The excimer lasers 14, 14' are operatively associated with the CPU 20 via a pair of cables 22, 22'. The YAG:Nd laser 16 is operatively associated with the CPU 20 via a cable 24. The $CO_2$ laser 18 is operatively associated with the CPU 20 via a cable 26.

The station is established in an open air environment. (This was found to work for the selected WC—Co substrate material.) An array of gas jets 28, 30 is also disposed around the support 12. The gas jet 28 is operatively associated with a source of $N_2$ gas 32 via a gas conduit 34. The gas jet 30 is operatively associated with a source of $CO_2$ gas 36 via a gas conduit 38.

A sample substrate (not shown) was selected and placed on the substrate support 12. The selected samples were WC—Co inserts for cutting tools generally having widths of about 15 mm although it is to be understood that a variety of sample substrates could be selected. Once the sample substrate was placed on the support 12, selected quantities of the $N_2$ and $CO_2$ gases were delivered to shroud the substrate radially. No hydrogen is involved. The focused lasers 14, 14' 16, and 18 were then activated and were are operated in their pulsing modes as directed by the program of the CPU 20. The lasers 14, 14', 16, and 18 were guided by drive motors (not shown) to move across the substrate surface in a programmed manner as dictated by the CPU 20.

During the operation, a luminous plasma is created a few mm above the surface of the substrate which itself undergoes surface melting. The sequence of the laser pulse width and pulse frequency are adjusted as elements of the process parameters. The duration of the deposition process is generally about 40 s, and this length of time was employed in the preparation of the test sample. (Normally it takes about 40 s to coat the WC—Co insert with an area of 1.5 cm$^2$.) During this time the growth rate approaches 1 $\mu$m/s and the resulting diamond film was shown to have a thicknesses of between 20 and 40 $\mu$m. Of course, it is to be understood that variations of the parameters including laser time and pulse rate effect variations of the growth rate and resulting film thickness. A more complete discussion of the process and its history may be found in co-pending U.S. Ser. No. 09/357, 621, filed concurrent with the present application.

This represents the first time four lasers have been applied in material synthesis. The described multiple laser process connects many interactions including photothermal and photolytic processes (see, in general, J. G. Eden, Photochemical Vapor Deposition, John Wiley and Sons, New York, 1992, pp. 5–46) and the formation of shock wave fronts at the surface.

Analysis of Resulting Diamond Coatings

Figure 2:
FIG. 2 is a secondary electron image of a cross-section of diamond coating on WC—Co insert with the bar corresponding to 10 $\mu$m.

A sample prepared using the above process is shown in FIG. 2 which is a secondary electron image of a cross-section of diamond coating on WC—Co insert with the bar corresponding to 10 $\mu$m. This image reveals a diamond coating on a WC—Co substrate which is consistent with other experimental findings which disclose that the coatings are typically 25–40 $\mu$m thick with average crystal grain size of 10–20 $\mu$m. Confirmation of the cubic diamond structure of these coatings is supported by the following data:

(1) Chemical analysis indicates carbon as the main component. The concentration of W in the film has been estimated as 0.2 wt %. Co concentration is lower. Electron microprobe showed that the W and Co concentrations were constant across the measured cross-section (i.e., from the interface to the top of the film). The concentrations of 0 and N are at the detectability limit of X-ray Photoelectron Spectroscopy (XPS) and Auger Electron Spectroscopy (AES).

(2) X-ray diffraction (CuK$\alpha$) indicates 111, 220, 311, 400 and 331 cubic diamond lines, they fit to lattice constant of $\alpha$=0.3567±0.0001 nm. The coatings differ in the degree of long range order.

(3) The position of the diamond Raman peak is shifted to 1336 cm$^{-1}$, indicating stress in the film. The narrowest line full width at half maximum was 6.4 cm$^{-1}$ and the peak to background ratio was 2.7. All films show luminescence.

(For a more detailed analysis of such analysis, see A. Badzian, R. Roy, P. Mistry, M. C. Turchan, in: A. Paoletti, A. Tucciarone (Eds.) The Physics of Diamond, IOS Press, Amsterdam, 1997.)

The films prepared according to the above-described process differ from conventional CVD films in many respects. The sample coatings are contaminated by W and Co and have particulates (~1 $\mu$m in size) on the top surface composed of W, CO and C. Despite some similarity in photoluminescence, they differ in many other signatures. Coating morphology has a non-columnar microstructure which also differs from CVD films.

The Diamond-WC—Co Interface

Adhesion of diamond coatings to the WC—Co inserts was found to be very strong. The resulting sample was tested for adhesion using a Rockwell Superficial Hardness tester. Three indents were made on the specimen using a Brale-C type indenter. A load of 45 kg was applied. An optical microscope was used to determine if any delamination or cracking had occurred. No cracking or delamination was observed for the three indents. A small rupture, where the indenter and the sample came into contact, was the only evidence that the load was applied.

Figure 3:
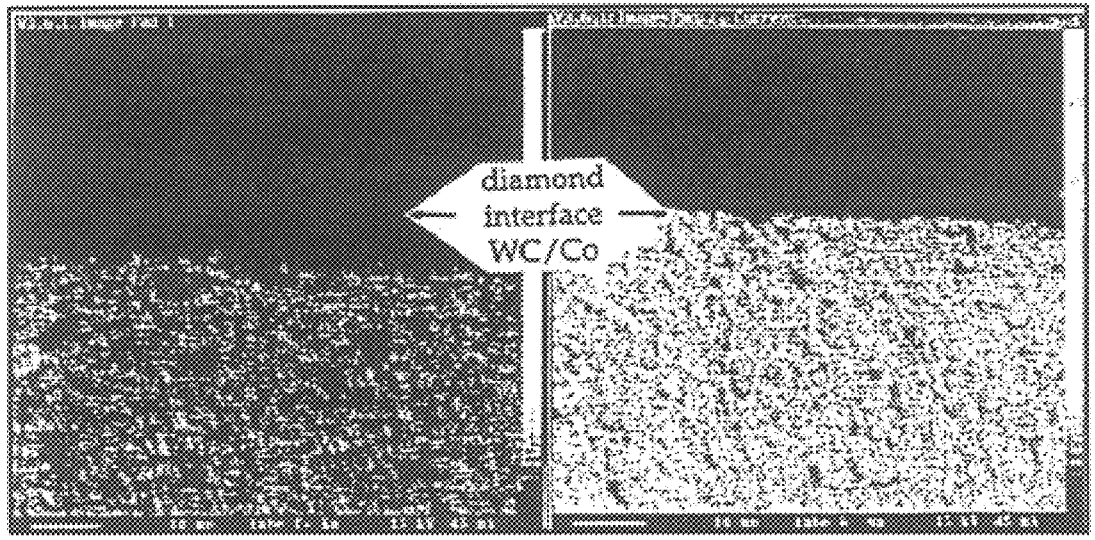
FIG. 3 discloses a pair of side-by-side X-ray maps taken on cross-section as shown in FIG. 2 by electron microprobe with the left image mapping Co(K) distribution and the right mapping W(M) distribution and showing depletion in Co down to 7 $\mu$m below the diamond-WC—Co interface.

The sample inserts have been tested for wear resistance by an outside service supplier and were found to be slightly inferior to polycrystalline diamond compacts but much better than CVD coatings. This result is consistent with the chemical composition of the WC—Co alloy at the interface. An electron microprobe analysis shows a layer in the WC—Co substrate depleted of Co. This is illustrated in FIG. 3. With particular reference to that figure, a pair of side-by-side X-ray maps taken on cross-section with a microprobe are shown. The left image maps Co(K) distribution. The right image maps W(M) distribution. The depletion in Co is seen down to 7 $\mu$m below the diamond-WC—Co interface. Removing some of the Co from intergranular regions, before diamond nucleation begins, creates a strong bonding condition for the diamond, which anchors between the WC grains. Were this not the case, a rough interface would be created between the metal and insulator.

The Upper Surface of The Coating

The sample disclosed that particulates of WC—Co—C (tungsten carbide-cobalt-carbon) alloy are spread over the top surface. It is believed that they were formed by condensation from the vapor phase of metal-containing molecules.

Figure 4:
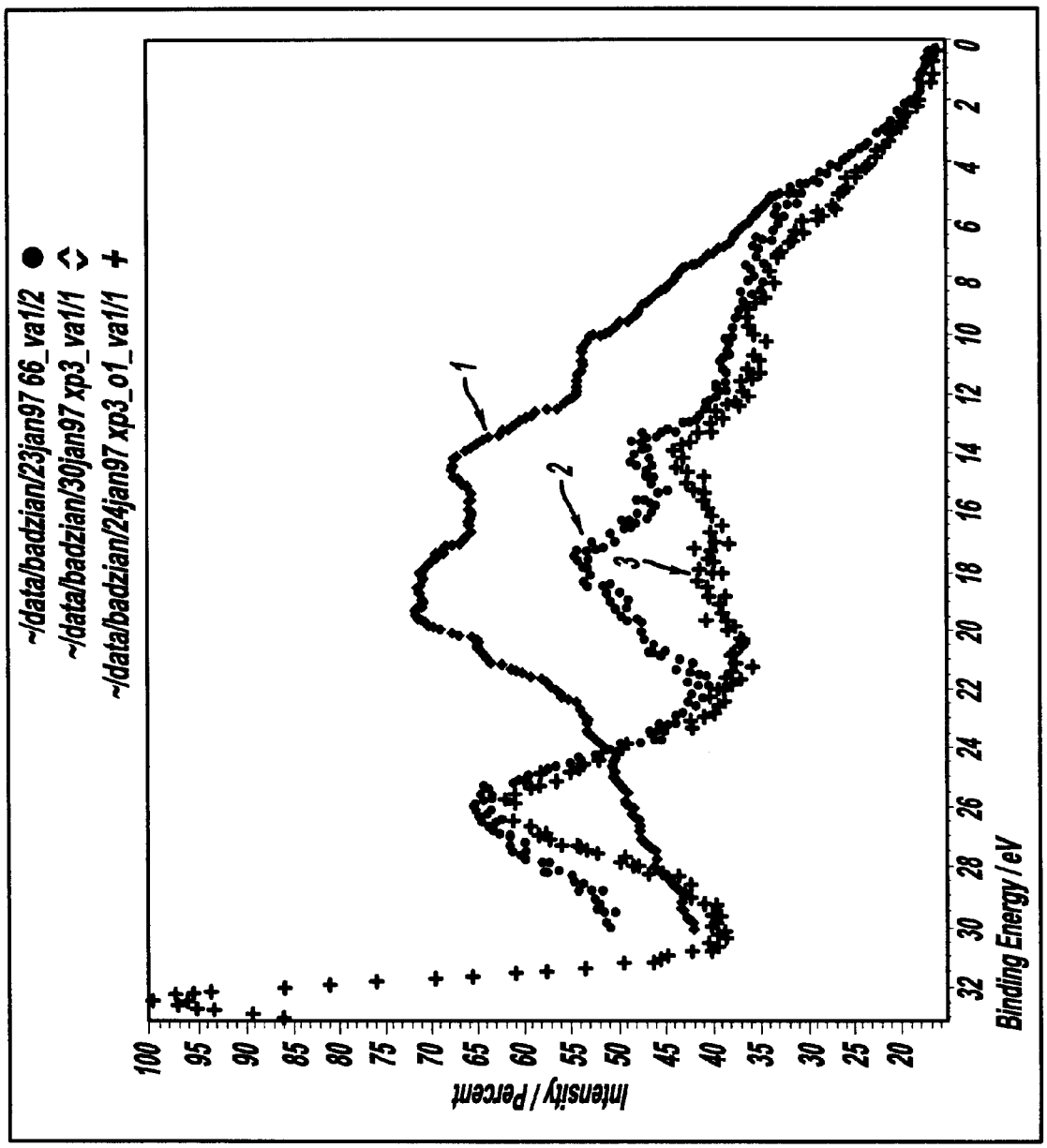
FIG. 4 is a valence band spectra taken with MgK and specifically showing CVD disordered diamond grown from $CH_4$—$H_2$—$N_2$—$O_2$ microwave plasma, the sample diamond as grown, and the sample diamond annealed in $H_2$ plasma.

XPS spectra taken from the top surface confirm carbon as the main component. The valence band spectra show some differences from CVD diamond. The CVD diamond sample was prepared by microwave plasma CVD, with $N_2$ and $O_2$ additions, at P=80 Torr and at a substrate temperature of 950° C. (See B. L. Weiss, A. Badzian, L. Pilione, T. Badzian, W. Drawl, Appl. Phys. Lett. 7 (1997) 794.) Comparisons of the spectra are shown in FIG. 4 which illustrates valence band spectra taken with MgK. FIG. 4 also shows CVD disordered diamond grown from $CH_4$—$H_2$—$N_2$—$O_2$ microwave plasma and a comparison between the sample diamond as grown and the sample diamond annealed in microwave $H_2$ plasma for 15 min at 950° C. The feature at 26 eV can be related to O and the peak at 32 eV to W/C alloy.

Electron Field Emission

A considerable amount of research has been reported on field emission from diamond. Recent studies have shown low turn on fields (~1 V/$\mu$m) for electron emission devices. (Reference may be had to J. W. Geis, J. C. Twitchell, T. M. Lyszczarz, J. Vac. Sci. Technol. B14 (1996) 2060 and K. Okano, S. Koizumi, S. Ravi, P. Silva, G. A. J. Amaratunga, Nature 381 (1996) 140.) Cold cathode applications require materials which show a proper combination of dielectric strength and electrical carrier transport.

The samples prepared following the above-stated method, with a combination of exceptional adherence of diamond film to the substrate and anticipated doping of diamond with W and Co atoms, can facilitate electron field emission. A more complete discussion of the application of the present method for uses in electron field emission may be found in co-pending U.S. Ser. No. 91/357,622, filed concurrent with the present application.

Figure 5:
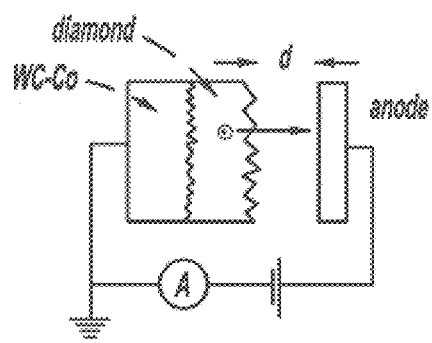
FIG. 5 is a schematic of an electron field emission measurement system with the anode being five times smaller than diamond coatings.

The electron emission measurements have been performed using the system shown in FIG. 5 in a vacuum of $10^{-7}$ Torr. The anode-diamond surface spacing was set in the range of 20–50 $\mu$m. The anode cross-section is 0.33 cm$^2$ and diamond surface area is 1.5 cm$^2$.

The rough metal-insulator interface can cause an enhancement of electron injection into the diamond conduction band by internal field emission. Specifically, the 1 $\mu$m WC crystals cause a field enhancement at the metal-diamond interface. The top surface of the diamond film also enhances electron emission due to the sharp edges of the diamond crystals (refer back to FIG. 2), which cause a concentration of the electrical field lines.

Figure 6:
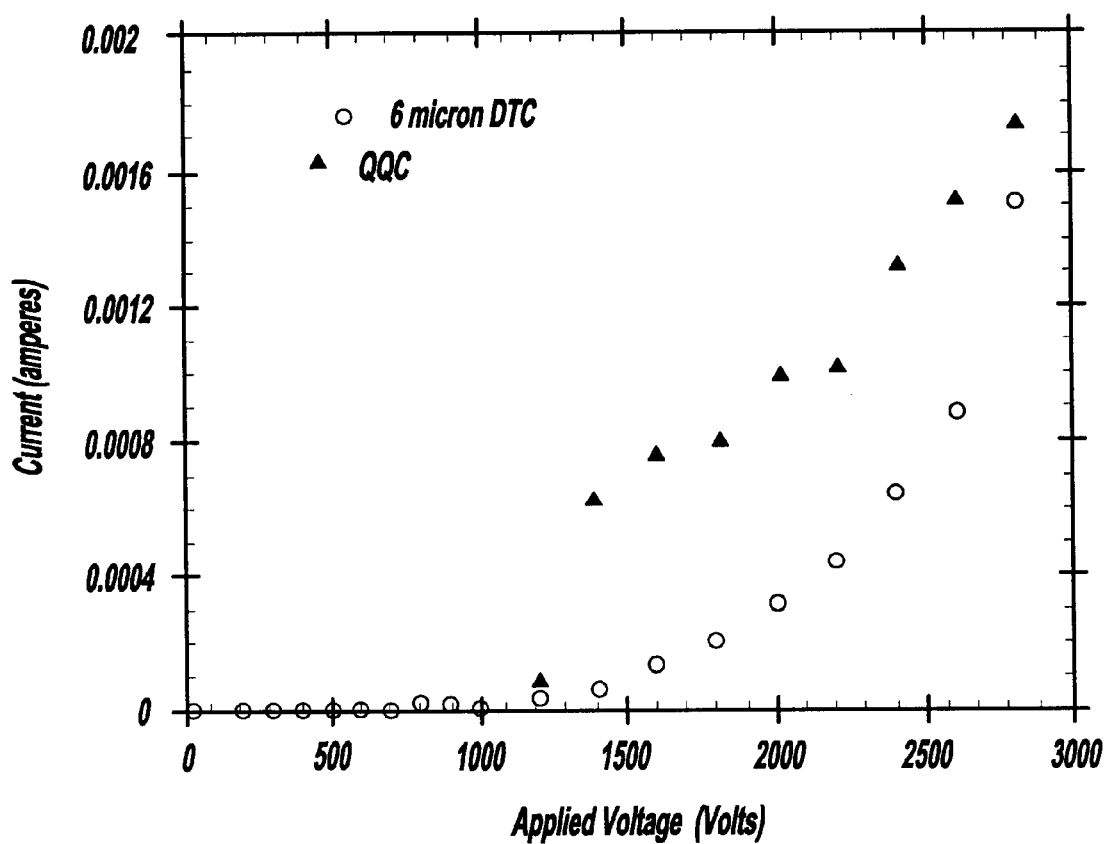
FIG. 6 is a comparison of I–V curves for the sample coating and disordered tetrahedral carbon (DTC) grown from $CH_4$—$H_2$—$N_2$—$O_2$ plasma.
Figure 7:
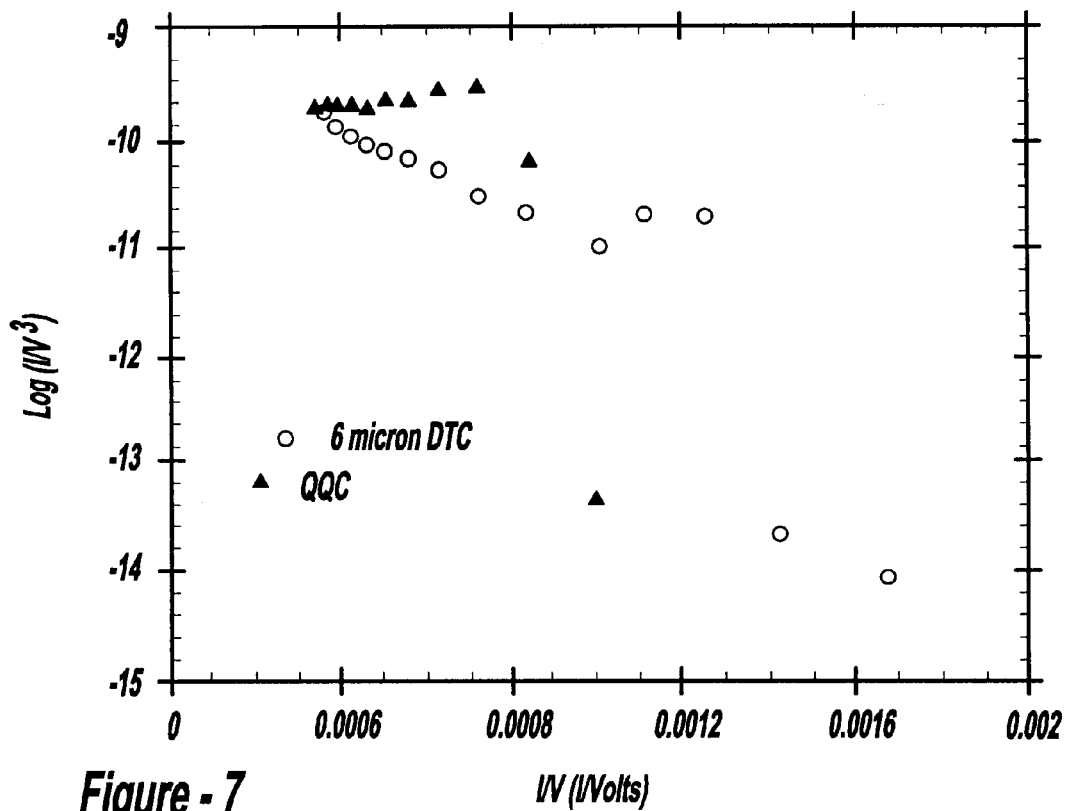
FIG. 7 is a comparison of Fowler-Nordheim plots for I–V shown in FIG. 6.
Figure 8:
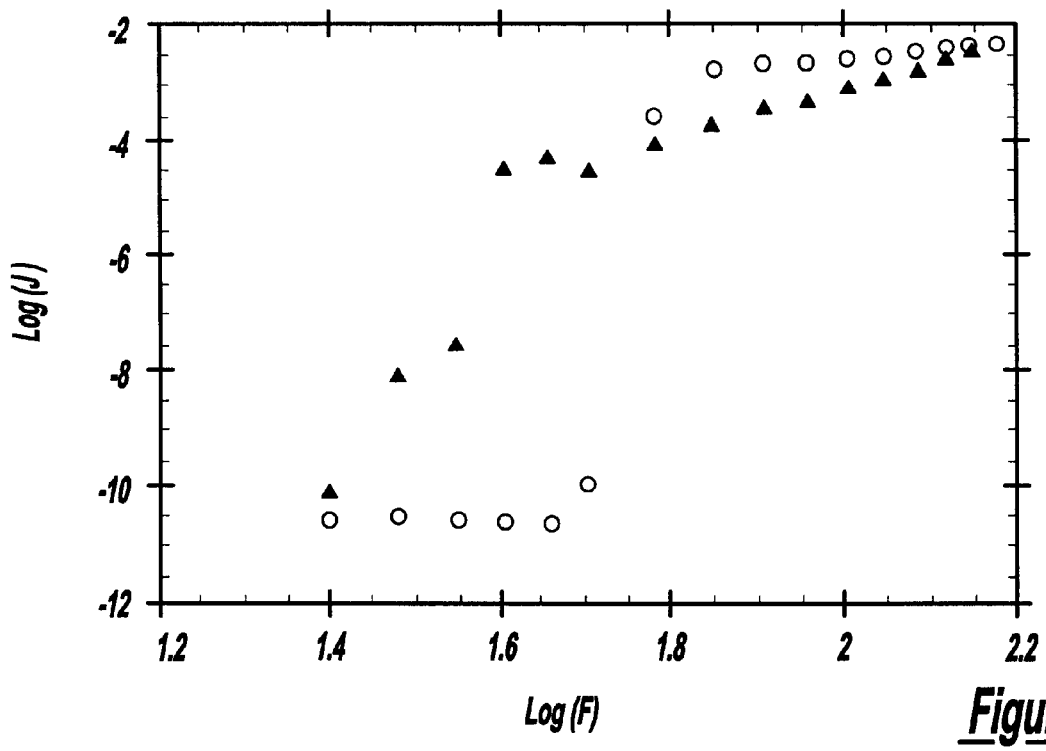
FIG. 8 is a logarithmic plot of I–V data.

The I–V curves of FIG. 6, the Fowler-Nordheim (FN) plots of FIG. 7 and the logarithmic plots of FIG. 8 show a comparison of the sample diamond article prepared according to the above process and the CVD diamond. More particularly, FIG. 6 illustrates a comparison of I–V curves for the sample coating and disordered tetrahedral carbon (DTC) grown from $CH_4$—$H_2$—$N_2$—$O_2$ plasma, FIG. 7 is a comparison of Fowler-Nordheim plots for I–V shown in FIG. 6, and FIG. 8 is a logarithmic plot of the generated I–V data.

The CVD diamond films were grown from a microwave plasma with $N_2$ and $O_2$ additions to the $CH_4/H_2$ mixture. Under such conditions, the tetrahedral network of carbon atoms is distorted and this is regarded by the inventors herein as diamond disordered tetrahedral carbon. The I–V curves indicate similar turn-on voltages for both samples, however, the emission current is noticeably different. The FN plots further highlight this difference. The sample coatings appear to have the requirements for a cold cathode material. The films had an electrical resistance in the range of M$\Omega$. This can be attributed to the presence of metals in the film. The maximum applied voltage was 3000 V, for a ~20 $\mu$m film-anode spacing.

A cautionary statement about electric field calculations should be made. It would be convenient to determine the electric field from F=(Applied Voltage)/(film-anode spacing). However, the potential drop across the film, which determines the breakdown field, and the vacuum field, which determines the tunnelling barrier, are not known. These observations are significant when interpreting the I–V and FN characteristics.

It is speculated that the incorporation of W and Co and perhaps N and O, together with the formation of associated lattice defects, connected to observed photoluminescence, can affect the electronic band structure of diamond and create additional localized electronic states in the band gap. These new states can facilitate injection of electrons into the conduction band of diamond and undergo quasiballistic transport through the film. As such, ballistic transport can be a limiting step for electron emission. Also, the negative electron affinity property of diamond is of importance, however, electrons still need to be injected into the conduction band and transported to the surface to exploit the NEA.

Cutler et al. (P. H. Cutler, Z. H. Huang, N. M. Miskovsky, P. D. Ambrosio, N. M. Chung, J. Vac. Sci. Technol. B14 (1996) 2020) using Monte Carlo (MC) simulation demonstrated that diamond does exhibit ballistic or quasi-ballistic behavior. The nature of the transport depends upon the electric field, film thickness and the types of interactions experienced by the electron.

Fitting et al. (H. J. Fitting, J. Boyde, J. Reinhardt, Phys. Stat. Sol. (1) 81 (1984) 323 and H. J. Fitting, A. Von Czarnowski, Phys. Stat. Sol. (a) 93 (1986) 385) performed MC simulations along with experimental electron energy distributions on II–VI materials. These studies also showed that the electrons exhibit a ballistic type transport and were termed 'hot' electrons (i.e., they had energies greater than the conduction minimum). Recently, Fitting et al. (H. J. Fitting, Th. Hingst, E. Schreiber, E. Beib, J. Vac. Sci. Technol. B14 (1996) 2087) have reported upon vacuum emission of hot electrons in GaAs.

Summary

The multiple laser assisted diamond growth process set forth and studied herein provides useful coatings for a variety of applications such as tool inserts because of the excellent adhesion characteristics. The following properties of these coatings were helpful in conducting electron field emission experiments:

adhesion of diamond to WC—Co substrate electrical conductivity of diamond coating caused by doping with W and Co atoms rough interface between WC—Co substrate and diamond coating rough top surface of diamond.

The emission current measured at 3000 V and film-anode distance of 20 $\mu$m reached 6 mA cm$^{-2}$ justifying application across a broad range of uses.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A coated substrate comprising:

a substrate;

a diamond coating on said substrate; and an interface between said substrate and said diamond coating, said coating being between 25 and 40 $\mu$m thick and being defined by crystals, the average size of each of said crystals being between 10 and 20 $\mu$m, said coating including tungsten and cobalt atoms incorporated into said coating, said coating including a layer depleted in cobalt approximately at said diamond-WC—Co interface.

2. The coated substrate of claim 1, wherein said coating includes a top surface and wherein said top surface includes particulates of WC—Co—C alloy spread thereover.

3. The coated substrate of claim 1, wherein said coating mainly comprises carbon.

4. The coated substrate of claim 1, wherein the depletion of Co appears down to 7 $\mu$m below the diamond-WC—Co interface.

5. The coated substrate of claim 1, wherein said substrate is substantially composed of WC—Co interface.

6. The coated substrate of claim 5, wherein the interface between the said diamond coating and said WC—Co substrate is unsmooth.

7. A system for diamond coating a substrate, the system comprising:

a substrate support;

an array of lasers situated about said substrate support, said array of lasers being selected from the group consisting of eximer, YAG:Nd, and $CO_2$ lasers;

a central processing unit operation associated with said array of lasers for controlling the operation of said lasers; and an array of gas jets situated about said substrate support to deliver gas to assist in coating the substrate.

8. The system for diamond coats a substrate of claim 7, further indicates a source of $N_2$ gas, said source being connected to at least one gas jet of said array of gas jets.

9. The system for diamond coating a substrate of claim 7, further including a source of $CO_2$ gas, said source being connected to at least one gas jet of said array of gas jets.

10. The system for diamond coating a substrate of claim 7, wherein said array of lasers includes two eximer lasers, one YAG:Nd laser, and one $CO_2$ laser.

11. A method for diamond coating a substrate, the method including the steps of:

forming a coating work station, by placing in proximity to a substrate support with an array of lasers, selected from the group consisting of eximers, YAG:Nd, and $CO_2$ lasers, connecting said lasers to a central processing unit, and additionally placing with proximity to said substrate support an array of gas jets;

selecting a substrate to be coated;

placing said selected substrate on said substrate support;

delivering at least one gas, from said gas jet substantially to said substrate;

activating said array of lasers; and continuing the delivery of gas and laser energy until a diamond coating is formed on said substrate.

12. The method of diamond coating a substrate of claim 11, wherein said lasers include four lasers.

13. The method of diamond coating, a substrate of claim 12, wherein said four lasers include two eximer lasers, are YAG:Nd laser, and one $CO_2$ laser.

14. The method of diamond coating a substrate of claim 11, further includes a source of $N_2$ gas, said source being connected to at least one gas jet of said array of gas jets.

15. The method of diamond coating a substrate of claim 11, further including a source of $CO_2$ gas, said source being connected to at least one gas jet of said array of gas jets.

16. The method of diamond coating a substrate of claim 11, wherein said selected substrate is substantially composed of WC—Co.

17. The method of diamond coating a substrate of claim 11, wherein said lasers are operated in their pulsing modes.

18. The method of diamond coating a substrate of claim 11, wherein the process of depositing a diamond coating is abut 40 seconds.

19. The method of diamond coating a substrate of claim 11, wherein the diamond growth rate during the deposition process approaches 1 to m/s.

20. The method of diamond coating a substitute of claim 11, wherein the deposition process is undertaken with an open-air environment.

* * * * *